(12) United States Patent
Kim et al.

(10) Patent No.: US 11,450,614 B2
(45) Date of Patent: Sep. 20, 2022

(54) SEMICONDUCTOR PACKAGE

(71) Applicant: Samsung Electronics Co., Ltd., Suwon-si (KR)

(72) Inventors: Jung Joo Kim, Daegu (KR); Sun Chul Kim, Hwaseong-si (KR); Min Keun Kwak, Asan-si (KR); Hyun Ki Kim, Asan-si (KR); Hyung Gil Baek, Suwon-si (KR); Yong Kwan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 17/035,000

(22) Filed: Sep. 28, 2020

(65) Prior Publication Data

US 2021/0320067 A1    Oct. 14, 2021

(30) Foreign Application Priority Data

Apr. 10, 2020    (KR) .................. 10-2020-0043752

(51) Int. Cl.
*H01L 23/48*        (2006.01)
*H01L 23/538*       (2006.01)
(Continued)

(52) U.S. Cl.
CPC ...... *H01L 23/5385* (2013.01); *H01L 21/4846* (2013.01); *H01L 23/49833* (2013.01);
(Continued)

(58) Field of Classification Search
CPC ............ H01L 23/5389; H01L 23/5385; H01L 23/49827
(Continued)

(56) References Cited

U.S. PATENT DOCUMENTS 7,368,821 B2    5/2008   Kim et al.
7,855,443 B2   12/2010   Tsai et al.
(Continued)

FOREIGN PATENT DOCUMENTS

KR      20060125574 A    12/2006
KR        101374144 B1    3/2014
KR        101712928 B1    3/2017

*Primary Examiner* — Nitin Parekh
(74) *Attorney, Agent, or Firm* — Muir Patent Law, PLLC

(57) ABSTRACT

There is provided a semiconductor package capable of preventing damage to an interposer to improve reliability. The semiconductor package includes a first substrate including a first insulating layer and first conductive patterns, an interposer disposed on a top surface of the first substrate and including a second insulating layer and second conductive patterns, first connecting members in contact with the top surface of the first substrate and a bottom surface of the interposer, and supporting members including solder parts, which are in contact with the top surface of the first substrate and the bottom surface of the interposer, and core parts, which are disposed in the solder parts and include a different material from the solder parts. The first connecting members electrically connect the first conductive patterns and the second conductive patterns, and the supporting members do not electrically connect the first conductive patterns and the second conductive patterns.

20 Claims, 18 Drawing Sheets

(51) Int. Cl.
  *H01L 25/10* (2006.01)
  *H01L 25/18* (2006.01)
  *H01L 21/48* (2006.01)
  *H01L 23/498* (2006.01)

(52) U.S. Cl.
  CPC ........ *H01L 23/5389* (2013.01); *H01L 25/105* (2013.01); *H01L 25/18* (2013.01); *H01L 23/49827* (2013.01); *H01L 2225/107* (2013.01); *H01L 2225/1023* (2013.01); *H01L 2225/1035* (2013.01); *H01L 2225/1041* (2013.01); *H01L 2225/1058* (2013.01)

(58) Field of Classification Search
  USPC ......................................................... 257/737
  See application file for complete search history.

(56) References Cited

U.S. PATENT DOCUMENTS

| | | | | |
|---|---|---|---|---|
| 8,779,606 B2 * | 7/2014 | Yim | ........................ | H01L 24/81 |
| | | | | 257/777 |
| 8,980,691 B2 * | 3/2015 | Lin | ........................ | H01L 25/50 |
| | | | | 438/666 |
| 8,994,185 B2 * | 3/2015 | Lin | ........................ | H05K 1/185 |
| | | | | 257/E23.001 |
| 9,128,148 B2 | 9/2015 | Lowney et al. | | |
| 9,406,600 B2 | 8/2016 | Kudo | | |
| 10,475,749 B2 | 11/2019 | Kim | | |
| 2007/0290376 A1 * | 12/2007 | Zhao | .................... | H01L 23/3128 |
| | | | | 257/E23.021 |
| 2010/0304530 A1 * | 12/2010 | Yim | ..................... | H01L 25/105 |
| | | | | 438/109 |
| 2012/0193783 A1 | 8/2012 | Hong et al. | | |
| 2013/0307140 A1 * | 11/2013 | Huang | ............. | H01L 23/49811 |
| | | | | 257/737 |
| 2014/0063768 A1 * | 3/2014 | Tanaka | ................ | H01L 23/3121 |
| | | | | 29/830 |
| 2015/0249065 A1 * | 9/2015 | Pagaila | .................... | H01L 25/03 |
| | | | | 257/737 |
| 2016/0118333 A1 * | 4/2016 | Lin | ........................ | H01L 23/528 |
| | | | | 257/773 |
| 2018/0190581 A1 * | 7/2018 | Lin | ..................... | H01L 21/6836 |
| 2019/0148310 A1 | 5/2019 | Leong et al. | | |
| 2020/0006214 A1 | 1/2020 | Tsai et al. | | |

* cited by examiner

SEMICONDUCTOR PACKAGE

This application claims priority to Korean Patent Application No. 10-2020-0043752, filed on Apr. 10, 2020, and all the benefits accruing therefrom under 35 U.S.C. § 119, the disclosure of which is incorporated herein by reference in its entirety.

BACKGROUND

1. Technical Field

The present disclosure relates to a semiconductor package, and more particularly, to a semiconductor package including an interposer.

2. Description of the Related Art

In accordance with developments in the electronic industry, the demand for highly-functional, high-speed, and compact-size electronic parts and elements has increased. In order to meet with this trend, a method in which several semiconductor chips are stacked and mounted on a single package substrate or in which a package is stacked on another package may be used. For example, a package-in-package (PIP)-type semiconductor package or a package-on-package (POP)-type semiconductor package may be used.

A POP-type semiconductor package may include an interposer, which is for electrically connecting upper and lower packages. The interposer can facilitate the connection between the upper and lower packages or can prevent warpage of the upper and lower packages.

SUMMARY

Embodiments of the present disclosure provide a semiconductor package capable of preventing damage to an interposer to improve reliability.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a semiconductor package comprising a first substrate including a first insulating layer and first conductive patterns in the first insulating layer, an interposer disposed on a top surface of the first substrate and including a second insulating layer and second conductive patterns in the second insulating layer, first connecting members in contact with the top surface of the first substrate and a bottom surface of the interposer, and supporting members including solder parts, which are in contact with the top surface of the first substrate and the bottom surface of the interposer, and core parts, which are disposed in the solder parts and include a different material from the solder parts. The first connecting members electrically connect the first conductive patterns and the second conductive patterns, and the supporting members do not electrically connect the first conductive patterns and the second conductive patterns.

According to an embodiments of the present disclosure, there is provided a semiconductor package comprising a first substrate including a first insulating layer and first conductive patterns in the first insulating layer, an interposer disposed on a top surface of the first substrate and including a second insulating layer and second conductive patterns in the second insulating layer, first connecting members between the first substrate and the interposer, electrically connecting the first conductive patterns and the second conductive patterns, and supporting members spaced apart from the first connecting members, between the first substrate and the interposer. The supporting members include solder parts, which have a first melting point, and core parts, which are disposed in the solder parts and have a second melting point that is higher than the first melting point.

According to an embodiment of the present disclosure, a first substrate including a first insulating layer and first conductive patterns in the first insulating layer, a first semiconductor chip mounted on a top surface of the first substrate, an interposer spaced apart from the first semiconductor chip, on the top surface of the first substrate, and including a second insulating layer and second conductive patterns in the second insulating layer, a second substrate disposed on a top surface of the interposer, a second semiconductor chip mounted on the second substrate, first connecting members electrically connecting the first conductive patterns and the second conductive patterns, between the first substrate and the interposer, supporting members disposed between the first substrate and the interposer and including core parts and solder parts, which surround the core parts and include a different material from the core parts, and second connecting members disposed between the interposer and the second substrate and electrically connecting the interposer and the second substrate. The supporting members do not electrically connect the first conductive patterns and the second conductive patterns.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Semiconductor packages according to some example embodiments of the present disclosure will hereinafter be described with reference to FIGS. 1 through 17.

Figure 1:
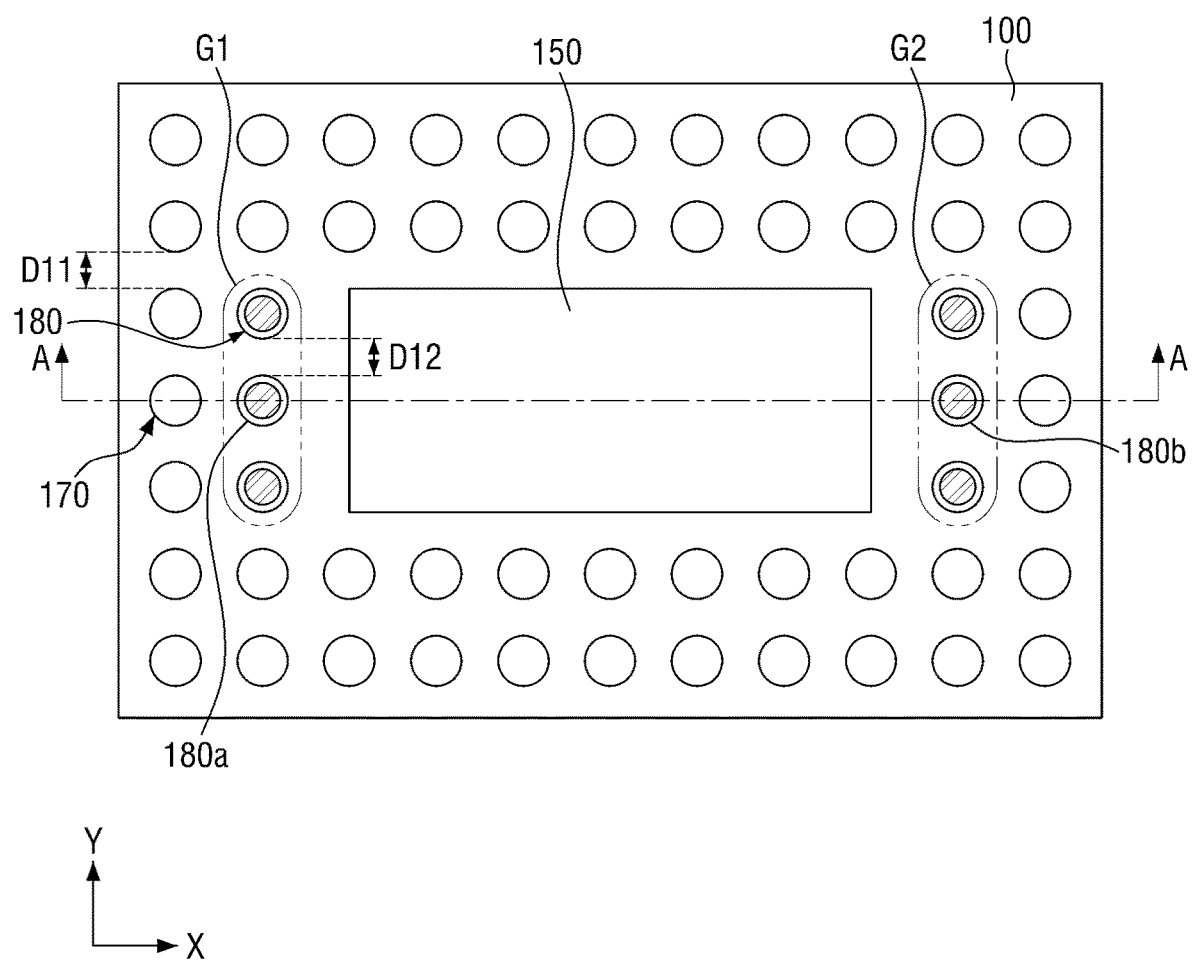
FIG. 1 is a layout view of a semiconductor package, according to some example embodiments of the present disclosure.
Figure 2:
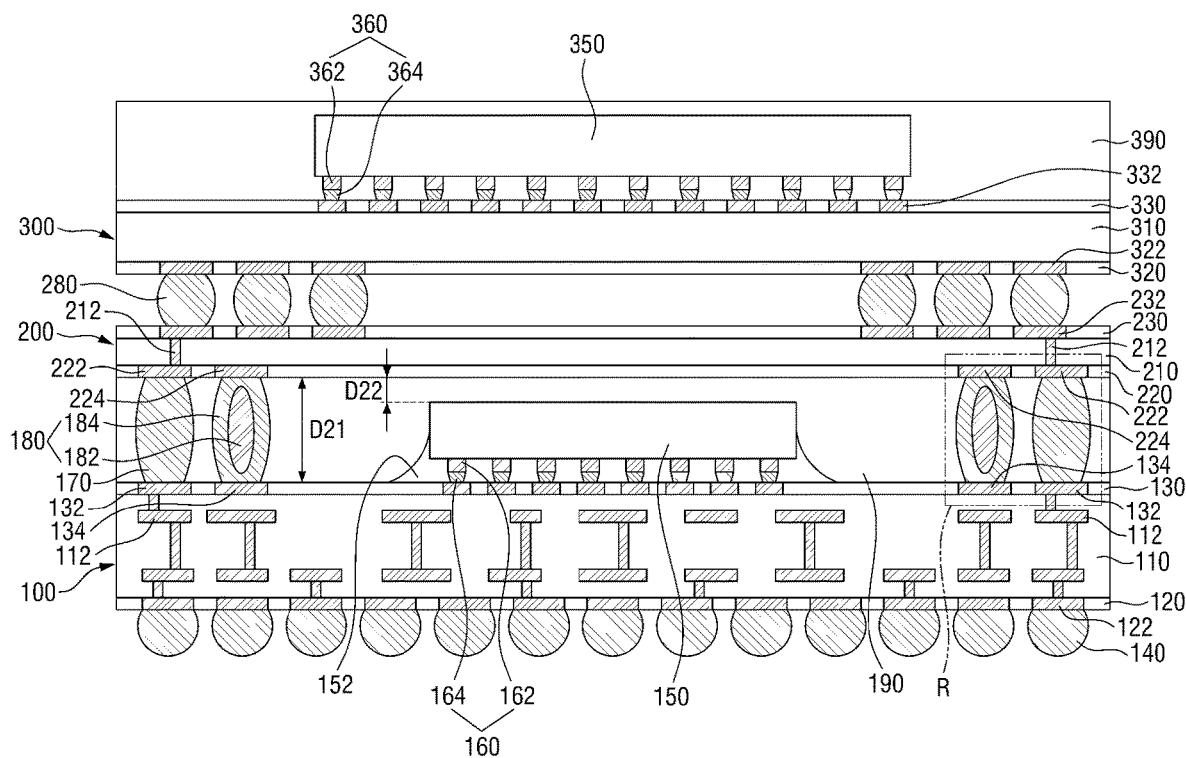
FIG. 2 is a cross-sectional view taken along line A-A of FIG. 1.
Figure 3:
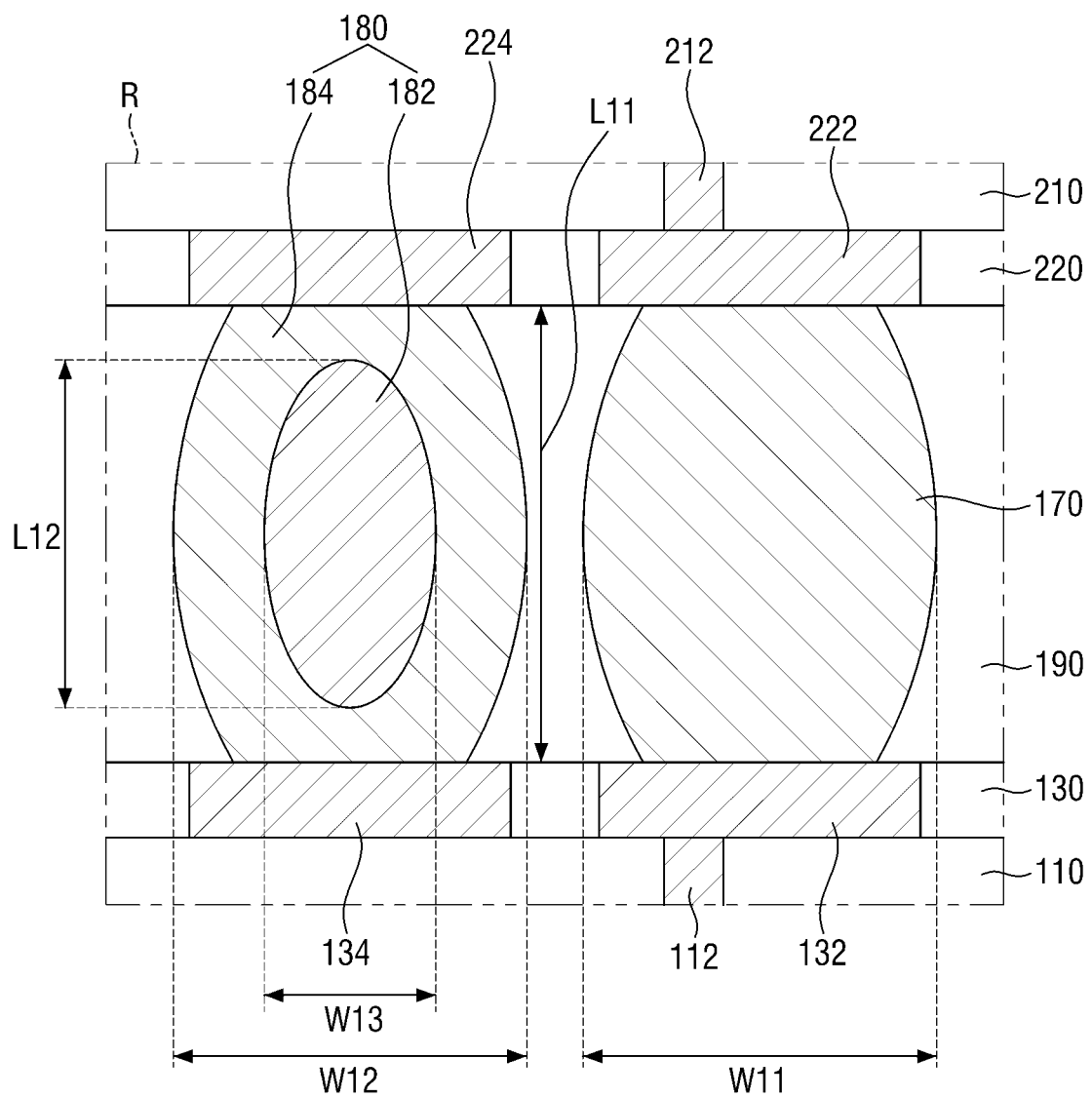
FIGS. 3 and 4 are enlarged views illustrating a region R of FIG. 2.
Figure 4:
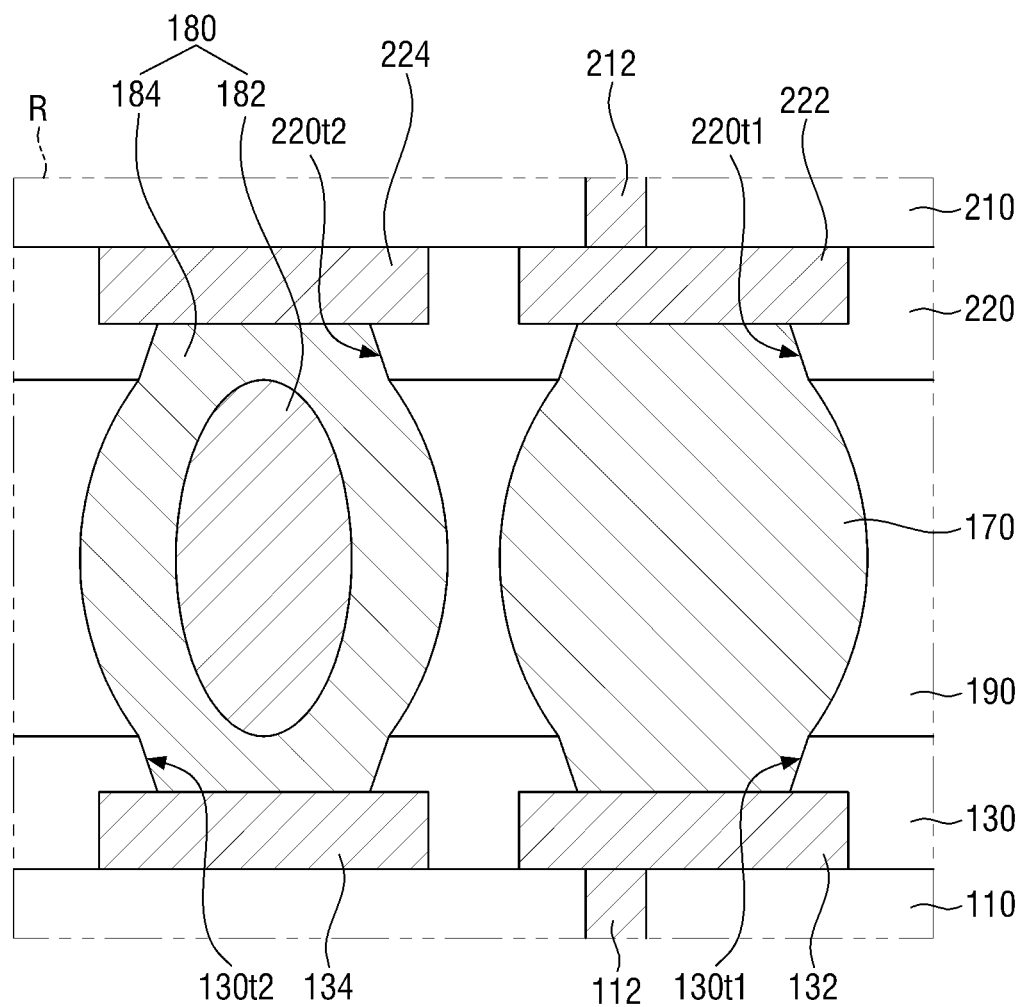

FIG. 1 is a layout view of a semiconductor package, according to some example embodiments of the present disclosure. FIG. 2 is a cross-sectional view taken along line A-A of FIG. 1. FIGS. 3 and 4 are enlarged views illustrating a region R of FIG. 2.

Referring to FIGS. 1 through 4, the semiconductor package includes a first substrate 100, a first semiconductor chip 150, an interposer 200, first connecting members 170, supporting members 180, a second substrate 300, a second semiconductor chip 350, and second connecting members 280.

The first substrate 100 may be a substrate for a package. For example, the first substrate 100 may be a printed circuit board (PCB) or a ceramic substrate. In another example, the first substrate 100 may be a substrate for a wafer-level package (WLP). The first substrate 100 may have bottom and top surfaces that are opposite to each other.

The first substrate 100 may include a first insulating layer 110, first conductive patterns 112, a first lower passivation film 120, first lower pads 122, a first upper passivation film 130, first upper pads 132, and second upper pads 134.

The first insulating layer 110 and the first conductive patterns 112 in the first insulating layer 110 may form wiring patterns for electrically connecting the first lower pads 122 and the first upper pads 132. The first insulating layer 110 is illustrated as having a single-layer structure, but the present disclosure is not limited thereto. For example, the first insulating layer 110 may be formed to have a multilayer structure to form multilayer first conductive patterns 112.

The first lower passivation film 120 and the first lower pads 122 may be formed on the bottom surface of the first insulating layer 110. The first lower pads 122 may be electrically connected to the first conductive patterns 112. The first lower passivation film 120 may cover the bottom surface of the first insulating layer 110 and may expose the first lower pads 122.

In some embodiments, third connecting members 140 may be formed on the bottom surface of the first substrate 100. The third connecting members 140 may be attached to the first lower pads 122. The third connecting members 140 may have, for example, a spherical or an elliptical spherical shape, when viewed in plan view, but the present disclosure is not limited thereto. The third connecting members 140 may include, for example, tin (Sn), indium (In), bismuth (Bi), antimony (Sb), copper (Cu), silver (Ag), zinc (Zn), lead (Pb), or a combination thereof, but the present disclosure is not limited thereto.

The third connecting members 140 may electrically connect the first substrate 100 and an external device. Accordingly, the third connecting members 140 may provide electrical signals to the first substrate 100 or may provide electrical signals from the first substrate 100 to the external device.

The first upper passivation film 130, the first upper pads 132, and the second upper pads 134 may be formed on the top surface of the first insulating layer 110. The first upper passivation film 130 may cover the top surface of the first insulating layer 110 and may expose the first upper pads 132 and the second upper pads 134. In some embodiments, top surfaces of the first upper passivation film 130, the first upper pads 132, and the second upper pads 134 may be coplanar with one another, and bottom surfaces of the first upper passivation film 130, the first upper pads 132, and the second upper pads 134 may be coplanar with one another. In other embodiments, a top surface of the first upper passivation film 130 may be at a higher vertical level (e.g., in a direction perpendicular to a top surface of the first substrate 100) than top surfaces of the first upper pads 132 and the second upper pads 134, and bottom surfaces of the first upper passivation film 130, the first upper pads 132, and the second upper pads 134 may be coplanar with one another. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise.

In some embodiments, the first upper pads 132 may be electrically connected to the first lower pads 122, and the second upper pads 134 may not be electrically connected to the first lower pads 122. For example, the first upper pads 132 may be in contact with the first conductive patterns 112, and the second upper pads 134 may not be in contact with the first conductive patterns 112. In some embodiments, bottom surfaces of the second upper pads 134 may contact only a top surface of the first insulating layer 110.

The first lower passivation film 120 and the first upper passivation film 130 may include, for example, a photo-imageable dielectric (PID) material, but the present disclosure is not limited thereto.

The first semiconductor chip 150 may be disposed on the first substrate 100. For example, the first semiconductor chip 150 may be mounted on the top surface of the first substrate 100. The first semiconductor chip 150 may be an integrated circuit (IC) into which hundreds to millions of semiconductor elements are integrated. For example, the first semiconductor chip 150 may be an application processor (AP) such as a central processing unit (CPU), a graphic processing unit (GPU), a field-programmable gate array (FPGA), a digital signal processor, a cryptographic processor, a microprocessor, a microcontroller, or the like, but the present disclosure is not limited thereto. For example, the first semiconductor chip 150 may be a logic chip such as an analog-to-digital converter (ADC) or an application-specific IC (ASIC) or a memory chip such as a volatile memory (e.g., a dynamic random access memory (DRAM)) or a nonvolatile memory (e.g., a read-only memory (ROM) or a flash memory). Also, the first semiconductor chip 150 may be the combination of a logic chip and a memory chip.

FIGS. 1 through 4 illustrate that only one first semiconductor chip 150 is formed on the first substrate 100, but the present disclosure is not limited thereto. For example, the plurality of first semiconductor chips 150 may be formed side-by-side on the first substrate 100 or may be sequentially stacked on the first substrate 100.

In some embodiments, the first semiconductor chip 150 may be mounted on the first substrate 100 via flip-chip bonding. For example, first bumps 160 may be formed between the top surface of the first substrate 100 and the bottom surface of the first semiconductor chip 150. The first bumps 160 may electrically connect the first substrate 100 and the first semiconductor chip 150.

Each of the first bumps 160 may include, for example, a first pillar layer 162 and a first solder layer 164.

The first pillar layers 162 may protrude from the bottom surface of the first semiconductor chip 150. For example, the first pillar layers 162 may include Cu, a Cu alloy, Ni, a Ni alloy, Pd, Pt, Au, Co, or a combination thereof, but the present disclosure is not limited thereto.

The first solder layers 164 may connect the first pillar layers 162 and the first substrate 100. For example, the first solder layers 164 may be connected to some of the first upper pads 132. The first solder layers 153 may have, for example, a spherical or elliptical spherical shape, when viewed in plan view, but the present disclosure is not limited thereto. The first solder layers 164 may include, for example, Sn, In, Bi, Sb, Cu, Ag, Zn, Pb, or a combination thereof, but the present disclosure is not limited thereto.

The interposer 200 may be interposed between the first and second substrates 100 and 300. For example, the interposer 200 may be disposed on the top surface of the first substrate 100. In some embodiments, the interposer 200 may be disposed on the top surface of the first semiconductor chip 150. The interposer 200 may facilitate connecting the first and second substrates 100 and 300. Also, the interposer 200 may prevent warpage of the first and second substrates 100 and 300.

The interposer 200 may have bottom and top surfaces that are opposite to each other. For example, the bottom surface of the interposer 200 may face the top surface of the first substrate 100, and the top surface of the interposer 200 may face the bottom surface of the second substrate 300.

In some embodiments, the interposer 200 may be spaced apart from the first substrate 100. In some embodiments, a distance D21 from the top surface of the first substrate 100 to the bottom surface of the interposer 200 may be about 120 μm to about 200 μm.

In some embodiments, the interposer 200 may be spaced apart from the first semiconductor chip 150. In some embodiments, a distance D22 from the top surface of the first semiconductor chip 150 to the bottom surface of the interposer 200 may be about 15 μm to about 45 μm.

The interposer 200 may include a second insulating layer 210, second conductive patterns 212, a second lower passivation film 220, second lower pads 222, third lower pads 224, a second upper passivation film 230, and third upper pads 232.

The second insulating layer 210 and the second conductive patterns 212 in the second insulating layer 210 may form wiring patterns for electrically connecting the second lower pads 222 and the third upper pads 232. The second insulating layer 210 is illustrated as having a single-layer structure, but the present disclosure is not limited thereto. For example, the second insulating layer 210 may be formed to have a multilayer structure to form multilayer second conductive patterns 212.

The second lower passivation film 220, the second lower pads 222, and the third lower pads 224 may be formed on the bottom surface of the second insulating layer 210. The second lower passivation film 220 may cover the bottom surface of the second insulating layer 210 and may expose the second lower pads 222 and the third lower pads 224. For example, a top surface of the second lower passivation film 220 may contact the bottom surface of the second insulating layer 210. In some embodiments, top surfaces of the second lower passivation film 220, the second lower pads 222, and the third lower pads 224 may be coplanar with one another, and bottom surfaces of the second lower passivation film 220, the second lower pads 222, and the third lower pads 224 may be coplanar with one another. In other embodiments, top surfaces of the second lower passivation film 220, the second lower pads 222, and the third lower pads 224 may be coplanar with one another, and a bottom surface of the second lower passivation film 220 may be at a lower vertical level (e.g., in a direction perpendicular to the top surface of the first substrate 100) than bottom surfaces of the second lower pads 222 and the third lower pads 224.

In some embodiments, the second lower pads 222 may be electrically connected to the third upper pads 232, and the third lower pads 224 may not be electrically connected to the third upper pads 232. For example, the second lower pads 222 may be in contact with the second conductive patterns 212, and the third lower pads 224 may not be in contact with the second conductive patterns 212. In some embodiments, top surfaces of the third lower pads 224 may contact only a bottom surface of the second insulating layer 210.

The second upper passivation film 230 and the third upper pads 232 may be formed on the top surface of the second insulating layer 210. The third upper pads 232 may be electrically connected to the second conductive patterns 212. The second upper passivation film 230 may cover the top surface the second insulating layer 210 and may expose the third upper pads 232. For example, a bottom surface of the second upper passivation film 230 may contact the top surface of the second insulating layer 210.

The second lower passivation film 220 and the second upper passivation film 230 may include, for example, a photo-imageable dielectric material, but the present disclosure is not limited thereto.

The first connecting members 170 may be interposed between the first substrate 100 and the interposer 200. The first connecting members 170 may be in contact with the top surface of the first substrate 100 and the bottom surface of the interposer 200. The first connecting members 170 may electrically connect the first substrate 100 and the interposer 200. For example, the first connecting members 170 may be in contact with the first upper pads 132 of the first substrate 100 and the second lower pads 222 of the interposer 200. Accordingly, the first connecting members 170 may electrically connect the first conductive patterns 112 and the second conductive patterns 212.

A height L11 (of FIG. 3) of the first connecting members 170 may be the same as the distance D21 from the top surface of the first substrate 100 to the bottom surface of the interposer 200. Here, the term "height" means maximum length in a vertical direction that is perpendicular to the top surface of the first substrate 100. In some embodiments, the height L11 of the first connecting members 170 may be about 120 μm to about 200 μm.

In some embodiments, a width W11 of the first connecting members 170 may be about 120 μm to about 200 μm. Here, the term "width" means maximum length in a horizontal direction that is parallel to the top surface of the first substrate 100 (e.g., a first direction X or a second direction Y).

The first connecting members 170 may have, for example, a spherical or elliptical spherical shape, but the present disclosure is not limited thereto. The first connecting members 170 may include, for example, Sn, In, Bi, Sb, Cu, Ag, Zn, Pb, or a combination thereof, but the present disclosure is not limited thereto.

The supporting members 180 may be spaced apart from the first connecting members 170 in the first direction X and/or the second direction Y, and may be interposed between the first substrate 100 and the interposer 200. The supporting members 180 may be in contact with the top surface of the first substrate 100 and the bottom surface of the interposer 200.

In some embodiments, the supporting members 180 may be dummy connecting members that do not electrically connect the first substrate 100 and the interposer 200. For example, the supporting members 180 may be in contact with the second upper pads 134 of the first substrate 100 and the third lower pads 224 of the interposer 200. Accordingly, the supporting members 180 may not electrically connect the first conductive patterns 112 and the second conductive patterns 212.

The supporting members 180 may include solder parts 184 and core parts 182 in the solder parts 184. The solder parts 184 may surround the core parts 182. The core parts 182 may include a different material from the solder parts 184. The core parts 182 may have, for example, a spherical or elliptical spherical shape, but the present disclosure is not limited thereto.

The solder parts 184 may include, for example, Sn, In, Bi, Sb, Cu, Ag, Zn, Pb, or a combination thereof, but the present disclosure is not limited thereto.

The supporting members 180, which include the core parts 182, may support the interposer 200 so that the interposer 200 may maintain a predetermined distance (e.g., the distance D21 or D22) from the first substrate 100 (or from the first semiconductor chip 150) while being bonded onto the first substrate 100. This will be described later with reference to FIG. 18.

The core parts 182 may be formed to be smaller than the first connecting members 170. For example, as illustrated in FIG. 3, a height L12 of the core parts 182 may be smaller than the height L11 of the first connecting members 170. In some embodiments, the height L12 of the core parts 182 may be 75% to 90% of the height L11 of the first connecting members 170.

In a case where the height L12 of the core parts 182 is 75% or greater of the height L11 of the first connecting members 170, the supporting members 180 may support the interposer 200 so that the interposer 200 may maintain a predetermined distance from the first substrate 100 (or from the first semiconductor chip 150) while being bonded onto the first substrate 100. In a case where the height L12 of the core parts 182 is less than 90% of the height L11 of the first connecting members 170, the supporting members 180 secures a space for the solder parts 184, so that the non-wet defect of the supporting members 180 can be prevented during the bonding of the interposer 200 on the first substrate 100.

In some embodiments, the height L12 of the core parts 182 may be about 90 μm to about 180 μm.

In some embodiments, the solder parts 184 may completely surround the core parts 182. For example, the core parts 182 may not be in contact with the first substrate 100 and the interposer 200 due to the presence of the solder parts 184.

In some embodiments, a width W13 of the core parts 182 may be smaller than a width W12 of the solder parts 184. In some embodiments, the width W13 of the core parts 182 may be 75% to 90% of the width W12 of the solder parts 184. In some embodiments, the width W13 of the core parts 182 may be about 90 μm to about 180 μm. In some embodiments, the width W13 of the core parts 182 may be smaller than the width W11 of the first connecting members 170.

In some embodiments, the solder parts 184 may have a first melting point, and the core parts 182 may have a second melting point, which is higher than the first melting point. Accordingly, the core parts 182 can support the interposer 200 so that the interposer 200 can maintain a predetermined distance (e.g., the distance D21 or D22) from the first substrate 100 (or from the first semiconductor chip 150) while the solder parts 184 are becoming wet and being attached to the first substrate 100 and the interposer 200 in the process of bonding the interposer 200 on the first substrate 100.

In some embodiments, the solder parts 184 may include the same material as the first connecting members 170. For example, the solder parts 184 of the supporting members 180 and the first connecting members 170 may be formed on the same level. The expression "two elements being formed on the same level", as used herein, means that the two elements are formed by the same process and at the same time. In this case, the first connecting members 170 may have the first melting point.

In some embodiments, the supporting members 180 may be disposed closer than the first connecting members 170 to the first semiconductor chip 150. As the supporting members 180 are disposed close to the first semiconductor chip 150, the distance (e.g., the distance D22) between the first semiconductor chip 150 and the interposer 200 can be efficiency maintained in the process of bonding the interposer 200 on the first substrate 100.

Referring to FIG. 4, the first upper passivation film 130 may cover parts of the first upper pads 132 and parts of the second upper pads 134. For example, the first upper passivation film 130 may include first trenches 130t1, which expose parts of the first upper pads 132, and second trenches 130t2, which expose parts of the second upper pads 134.

In some embodiments, the lower parts of the first connecting members 170 may be formed in the first trenches 130t1 to be connected to the first upper pads 132. For example, the lower parts of the first connecting members 170 may contact side surfaces of the first upper passivation film 130 in the first trenches 130t1. In some embodiments, the lower parts of the supporting members 180 may be formed in the second trenches 130t2 to be connected to the second upper pads 134. For example, the lower parts of the supporting members 180 may contact side surfaces of the first upper passivation film 130 in the second trenches 130t2.

The second lower passivation film 220 may cover parts of the second lower pads 222 and parts of the third lower pads 224. For example, the second lower passivation film 220 may include third trenches 220t1, which expose parts of the second lower pads 222, and fourth trenches 220t2, which expose parts of the third lower pads 224.

In some embodiments, the upper parts of the first connecting members 170 may be formed in the third trenches 220t1 to be connected to the second lower pads 222. For example, the upper parts of the first connecting members 170 may side surfaces of the second lower passivation film 220 in the third trenches 220t1. In some embodiments, the upper parts of the supporting members 180 may be formed in the fourth trenches 220t2 to be connected to the third lower pads 224. For example, the upper parts of the supporting members 180 may contact side surfaces of the second lower passivation film 220 in the fourth trenches 220t2.

As illustrated in FIG. 1, a plurality of first connecting members 170 and a plurality of supporting members 180 may be formed between the first substrate 100 and the interposer 200. In some embodiments, the first connecting members 170 and the supporting members 180 may be arranged at regular intervals of a predetermined distance. For example, a distance D11 in the second direction Y between the plurality of first connecting members 170 may be the same as a distance D12 in the second direction Y between the plurality of supporting members 180. In some embodiments, distances in the second direction Y between a supporting member 180 and an adjacent first connecting member 170 may be the same as the distance D11 or the distance D12. In some embodiments, distances in the first direction X between a supporting member 180 and an adjacent first connecting member 170 may be the same as the distance D11 or the distance D12.

In some embodiments, a plurality of supporting members 180 may be arranged along at least one side of the first semiconductor chip 150. For example, as illustrated in FIG. 1, the plurality of supporting members 180 may form first and second groups G1 and G2 disposed on sides of the first semiconductor chip 150.

For example, the first semiconductor chip 150 may have a first side surface, which intersects a first direction X, and a second side surface, which is opposite to the first side surface. The first group G1 may include a plurality of first supporting members 180a, which are arranged along the first side surface. For example, the plurality of first supporting members 180a may be arranged along a second direction Y, which intersects the first direction X. The second group G2 may include a plurality of second supporting members 180b, which are arranged along the second side surface. For example, the plurality of second supporting members 180b may be arranged along the second direction Y.

Referring again to FIG. 2, in some embodiments, a first molding film 190 may be formed on the first substrate 100. The first molding film 190 may fill the gap between the first substrate 100 and the interposer 200. Accordingly, the first molding film 190 may cover and protect the first substrate 100, the first semiconductor chip 150, the first bumps 160, the first connecting members 170, and the supporting members 180. The first molding film 190 may contact surfaces of the first substrate 100, the first semiconductor chip 150, the first bumps 160, the first connecting members 170, and the supporting members 180. The first connecting members 170 and the supporting members 180 may penetrate the first molding film 190 to electrically connect the first substrate 100 and the interposer 200.

The first molding film 190 may include, for example, an insulating polymer material such as an epoxy molding compound (EMC), but the present disclosure is not limited thereto.

In some embodiments, an underfill 152 may be formed on the first substrate 100. The underfill 152 may fill the gap between the first substrate 100 and the first semiconductor chip 150. The underfill 152 may fix the first semiconductor chip 150 on the first substrate 100 and may thus prevent the first semiconductor chip 150 from being broken. The underfill 152 may cover the first bumps 160. The underfill 152 may surround and contact the first bumps 160. The first bumps 160 may penetrate the underfill 152 to electrically connect the first substrate 100 and the first semiconductor chip 150.

The underfill 152 may include, for example, an insulating polymer material such as an EMC, but the present disclosure is not limited thereto. In some embodiments, the underfill 152 may include a different material from the first molding film 190. For example, the underfill 152 may include an insulating material with greater fluidity than the first molding film 190. Accordingly, the underfill 152 may efficiently fill a narrow space between the first substrate 100 and the first semiconductor chip 150.

The second substrate 300 may be disposed on the top surface of the interposer 200. The second substrate 300 may be a substrate for a package. For example, the second substrate 300 may be a PCB or a ceramic substrate. Also, the second substrate 300 may be a substrate for a WLP. The second substrate 300 may have bottom and top surfaces that are opposite to each other. For example, the bottom surface of the second substrate 300 may face the top surface of the interposer 200.

The second substrate 300 may include a third insulating layer 310, a third lower passivation film 320, fourth lower pads 322, a third upper passivation film 330, and fourth upper pads 332.

The third insulating layer 310 and conductive patterns (not illustrated) in the third insulating layer 310 may form wiring patterns for electrically connecting the fourth lower pads 322 and the fourth upper pads 332. The third insulating layer 310 is illustrated as having a single-layer structure, but the present disclosure is not limited thereto. For example, the third insulating layer 310 may be formed to have a multilayer structure to form multilayer conductive patterns.

The third lower passivation film 320 and the fourth lower pads 322 may be formed on the bottom surface of the third insulating layer 310. The third lower passivation film 320 may cover the bottom surface of the third insulating layer 310 and may expose the fourth lower pads 322. In some embodiments, top surfaces of the third lower passivation film 320 and the fourth lower pads 322 may be coplanar with one another, and bottom surfaces of the third lower passivation film 320 and the fourth lower pads 322 may be coplanar with one another.

The third upper passivation film 330 and the fourth upper pads 332 may be formed on the top surface of the third insulating layer 310. The third upper passivation film 330 may cover the top surface of the third insulating layer 310 and may expose the fourth upper pads 332. In some embodiments, top surfaces of the third upper passivation film 330 and the fourth upper pads 332 may be coplanar with one another, and bottom surfaces of the third upper passivation film 330 and the fourth upper pads 332 may be coplanar with one another.

The third lower passivation film 320 and the third upper passivation film 330 may include, for example, a PID material, but the present disclosure is not limited thereto.

The second connecting members 280 may be interposed between the interposer 200 and the second substrate 300. The second connecting members 280 may be in contact with the top surface of the interposer 200 and the bottom surface of the second substrate 300. The second connecting members 280 may electrically connect the interposer 200 and the second substrate 300. For example, the second connecting members 280 may be in contact with the third upper pads 232 of the interposer 200 and the fourth lower pads 322 of the second substrate 300.

The second connecting members 280 may have, for example, a spherical or elliptical spherical shape, but the present disclosure is not limited thereto. The second connecting members 280 may include, for example, Sn, In, Bi, Sb, Cu, Ag, Zn, Pb, or a combination thereof, but the present disclosure is not limited thereto.

The second semiconductor chip 350 may be disposed on the second substrate 300. For example, the second semiconductor chip 350 may be mounted on the top surface of the second substrate 300. The second semiconductor chip 350 may be an IC into which hundreds to millions of semiconductor elements are integrated.

In some embodiments, the first semiconductor chip 150 may be a logic chip, as an AP, etc., and the second semiconductor chip 350 may be a memory chip such as a volatile memory (e.g., a DRAM) or a nonvolatile memory (e.g., a ROM or a flash memory).

FIGS. 1 through 4 illustrate that only one second semiconductor chip 350 is formed on the second substrate 300, but the present disclosure is not limited thereto. For example, the plurality of second semiconductor chips 350 may be formed side-by-side on the second substrate 300 or may be sequentially stacked on the second substrate 300.

In some embodiments, the second semiconductor chip 350 may be mounted on the second substrate 300 via flip-chip bonding. For example, second bumps 360 may be formed between the top surface of the second substrate 300 and the bottom surface of the second semiconductor chip 350. The second bumps 360 may electrically connect the second substrate 300 and the second semiconductor chip 350. For example, the second bumps 360 may contact the fourth upper pads 332.

The second bumps 360 may include, for example, second pillar layers 362 and second solder layers 364. The second pillar layers 362 and the second solder layers 364 may be similar to the first pillar layers 162 and the first solder layers 164, respectively, but detailed descriptions thereof will be omitted.

In some embodiments, a second molding film 390 may be formed on the second substrate 300. The second molding film 390 may cover and protect the second substrate 300, the second semiconductor chip 350, and the second bumps 360. The second molding film 390 may include, for example, an insulating polymer material such as an EMC, but the present disclosure is not limited thereto.

Figure 5:
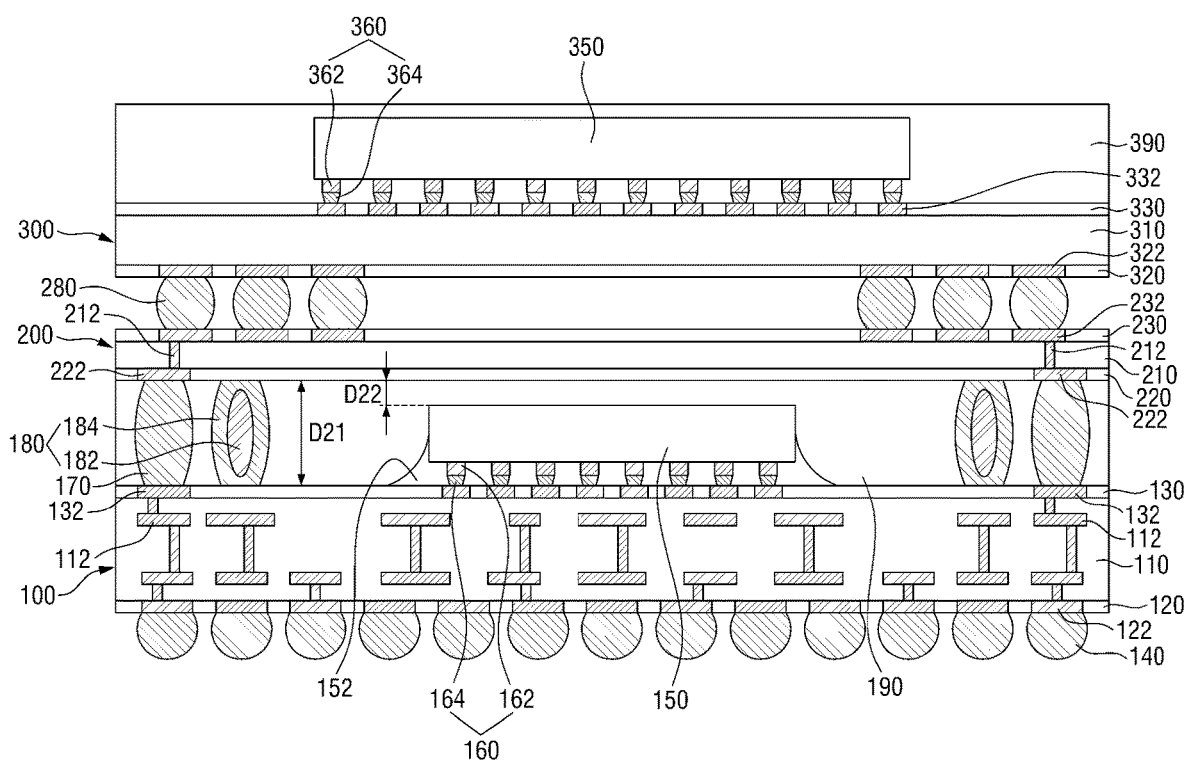
FIG. 5 is a cross-sectional view of a semiconductor package, according to some example embodiments of the present disclosure.

FIG. 5 is a cross-sectional view of a semiconductor package, according to some example embodiments of the present disclosure. For convenience, the semiconductor package of FIG. 5 will hereinafter be described, focusing mainly on the differences with the semiconductor package of FIGS. 1 through 4.

Referring to FIG. 5, supporting members 180 may be in contact with a first upper passivation film 130 and/or a second lower passivation film 220.

FIG. 5 illustrates that the supporting members 180 are in contact with both the first upper passivation film 130 and the second lower passivation film 220, but the present disclosure is not limited thereto. Alternatively, the supporting members 180 may be in contact with only one of the first upper passivation film 130 and the second lower passivation film 220. For example, the lower parts of the supporting members 180 may be in contact with the first upper passivation film 130, and the upper parts of the supporting members 180 may be in contact with third lower pads 224 (of FIG. 2). For example, the lower parts of the supporting members 180 may be in contact with second upper pads 134 (of FIG. 2), and the upper parts of the supporting members 180 may be in contact with the second lower passivation film 220.

The supporting members 180 may be dummy connecting members that are in contact with the first upper passivation film 130 and/or the second lower passivation film 220 and do not electrically connect the first substrate 100 and the interposer 200.

Figure 6:
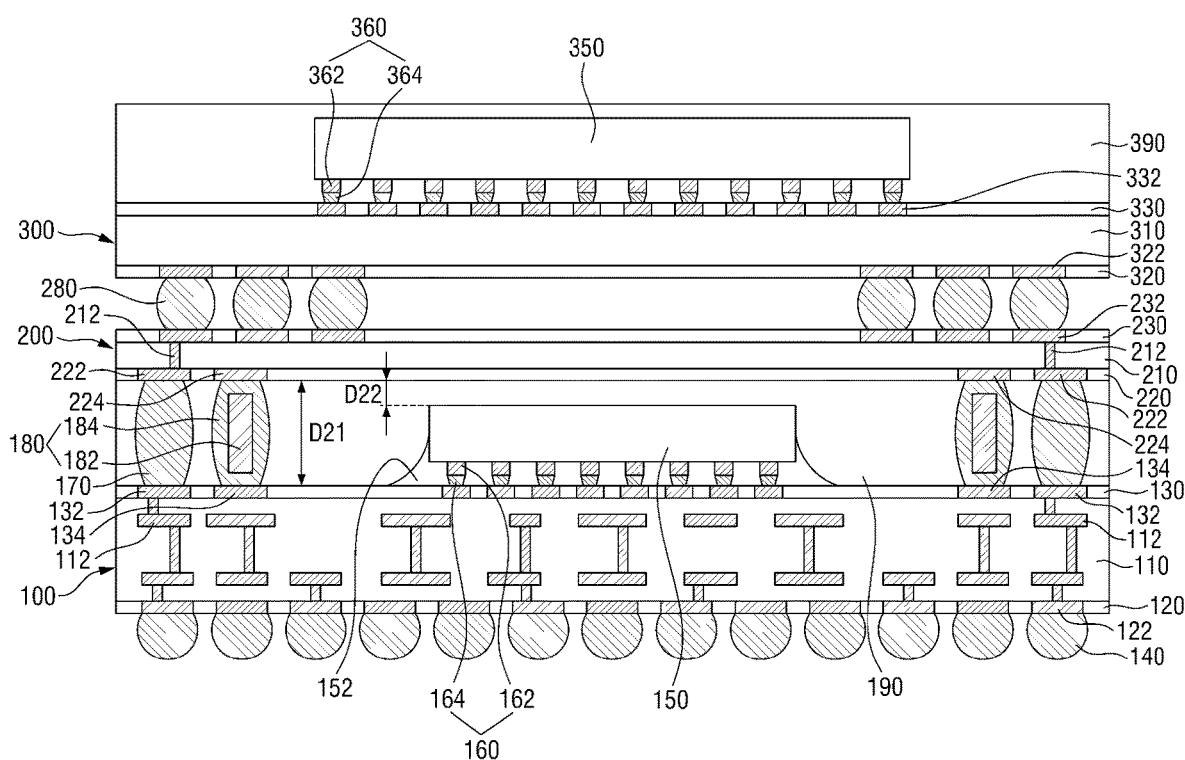
FIG. 6 is a cross-sectional view of a semiconductor package, according to some example embodiments of the present disclosure.
Figure 7:
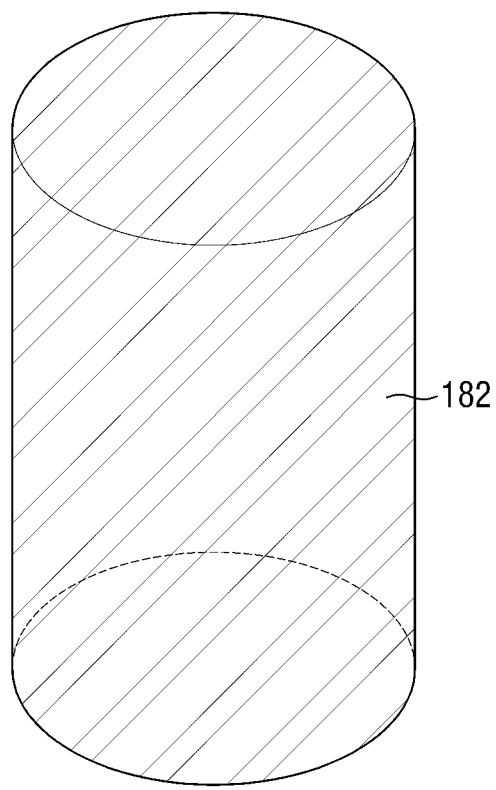
FIGS. 7 and 8 are perspective views of a core part of FIG. 6.
Figure 8:
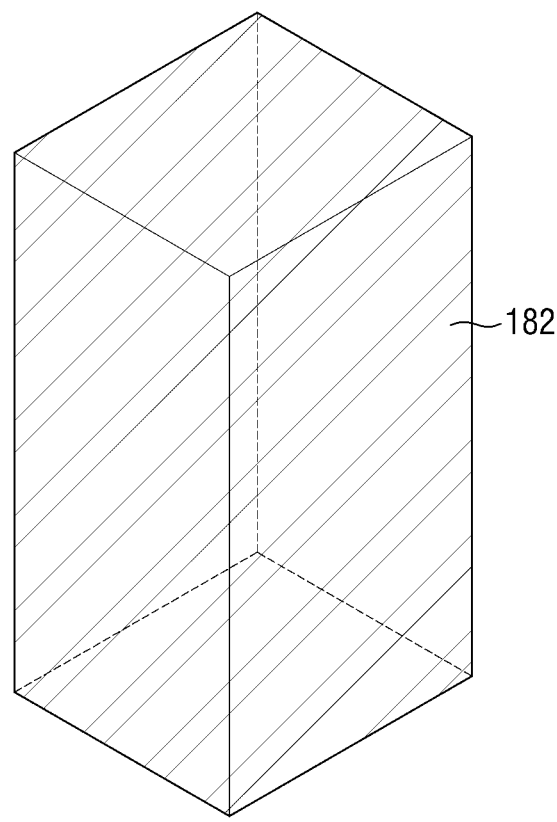

FIG. 6 is a cross-sectional view of a semiconductor package, according to some example embodiments of the present disclosure. FIGS. 7 and 8 are perspective views of a core part of FIG. 6. For convenience, the semiconductor package of FIGS. 6 through 8 will hereinafter be described, focusing mainly on the differences with the semiconductor package of FIGS. 1 through 4.

Referring to FIGS. 6 through 8, core parts 182 of supporting members 180 may be pillar-shaped.

In some embodiments, the axes of the core parts 182, which are pillar-shaped, may extend to intersect the top surface of a first substrate 100. For example, as illustrated in FIG. 7, the core parts 182 may have a cylindrical shape whose axis intersects the top surface of the first substrate 100 at a substantially right angle. For example, as illustrated in FIG. 8, the core parts 182 may have a polygonal pillar shape whose axis intersects the top surface of the first substrate 100 at a substantially right angle.

Figure 9:
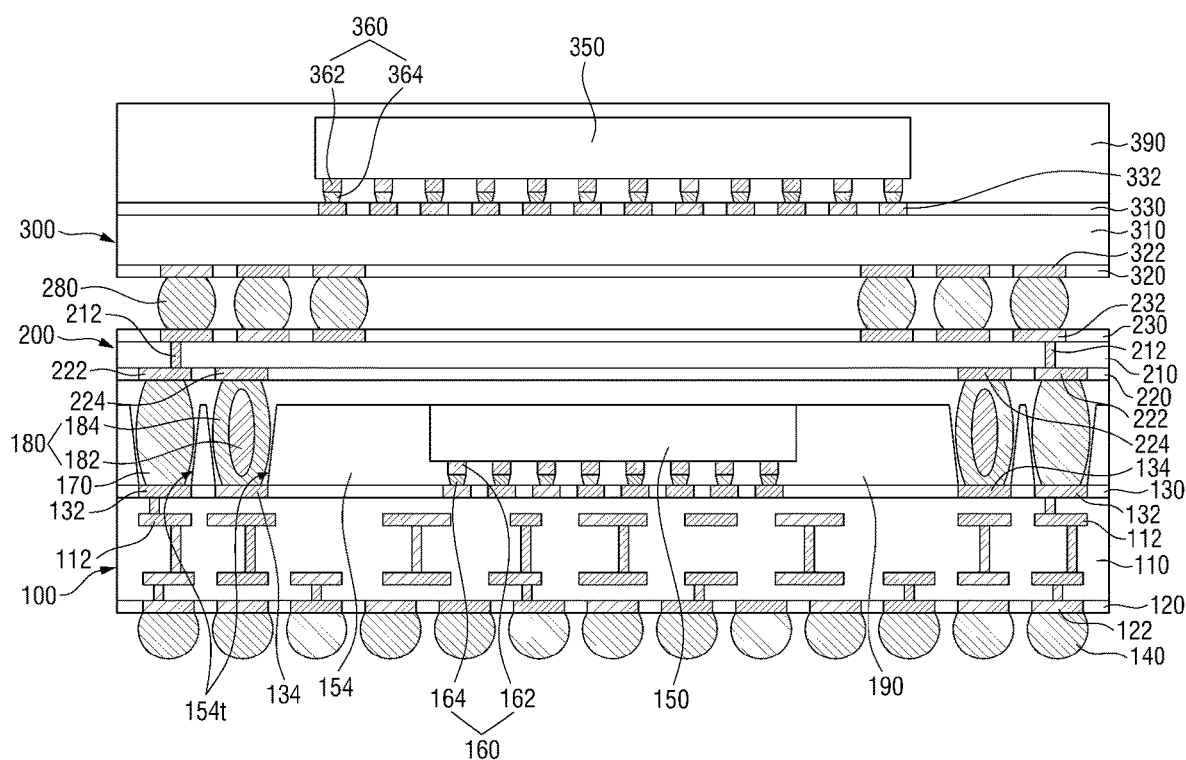
FIG. 9 is a cross-sectional view of a semiconductor package, according to some example embodiments of the present disclosure.

FIG. 9 is a cross-sectional view of a semiconductor package, according to some example embodiments of the present disclosure. For convenience, the semiconductor package of FIG. 9 will hereinafter be described, focusing mainly on the differences with the semiconductor package of FIGS. 1 through 4.

Referring to FIG. 9, the semiconductor package may further include a third molding film 154.

The third molding film 154 may cover the top surface of a first substrate 100 and side surfaces of a first semiconductor chip 150. In some embodiments, a top surface of the third molding film 154 may be coplanar with the top surface of the first semiconductor chip 150. The third molding film 154 may be formed between the first semiconductor chip 150, first connecting members 170, and supporting members 180. For example, the third molding film 154 may cover the top surface of the first substrate 100 and may include fifth trenches 154t, which expose first upper pads 132 and second upper pads 134. The first connecting members 170 and the supporting members 180 may be formed in the fifth trenches 154t and may be connected to the first upper pads 132 and the second upper pads 134, respectively.

In some embodiments, the top surface of the third molding film 154 may be spaced apart from the bottom surface of an interposer 200. Accordingly, a first molding film 190 may fill the gap between the third molding film 154 and the interposer 200.

The third molding film 154 may include, for example, an insulating polymer material such as an EMC, but the present disclosure is not limited thereto. In some embodiments, the third molding film 154 may include a different material from the first molding film 190. For example, the first molding film 190 may include an insulating material with greater fluidity than the third molding film 154. Accordingly, the first molding film 190 may efficiently fill a narrow space between the first semiconductor chip 150 and the interposer 200.

Figure 10:
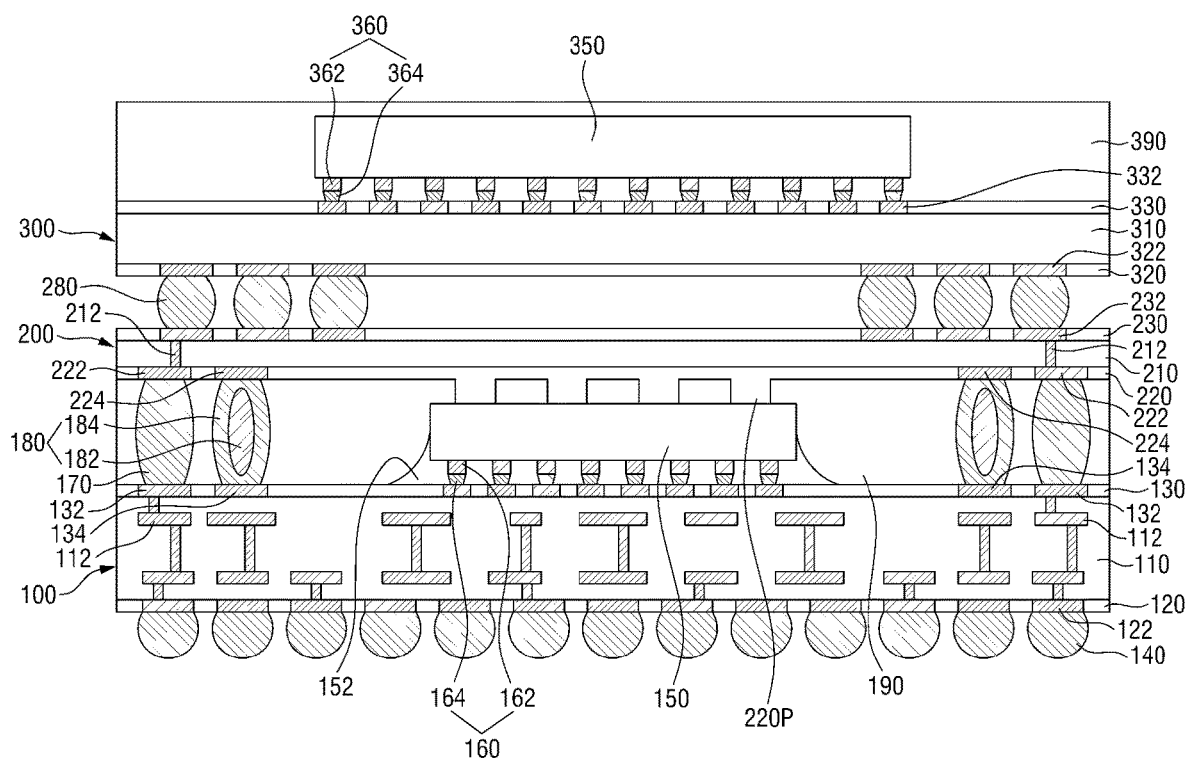
FIG. 10 is a cross-sectional view of a semiconductor package, according to some example embodiments of the present disclosure.

FIG. 10 is a cross-sectional view of a semiconductor package, according to some example embodiments of the present disclosure. For convenience, the semiconductor package of FIG. 10 will hereinafter be described, focusing mainly on the differences with the semiconductor package of FIGS. 1 through 4.

Referring to FIG. 10, an interposer 200 may further include protruding patches 220P.

For example, the protruding patches 220P may protrude from a second lower passivation film 220 in the direction of a first semiconductor chip 150 to face the top surface of the first semiconductor chip 150. A plurality of protruding patches 220P may be formed to support the interposer 200 from above the first semiconductor chip 150.

FIG. 10 illustrates that all the protruding patches 220P are in contact with the top surface of the first semiconductor chip 150, but the present disclosure is not limited thereto. For example, at least some of the protruding patches 220P may be spaced apart from the top surface of the first semiconductor chip 150 depending on the size of first connecting members 170 or supporting members 180.

Figure 11:
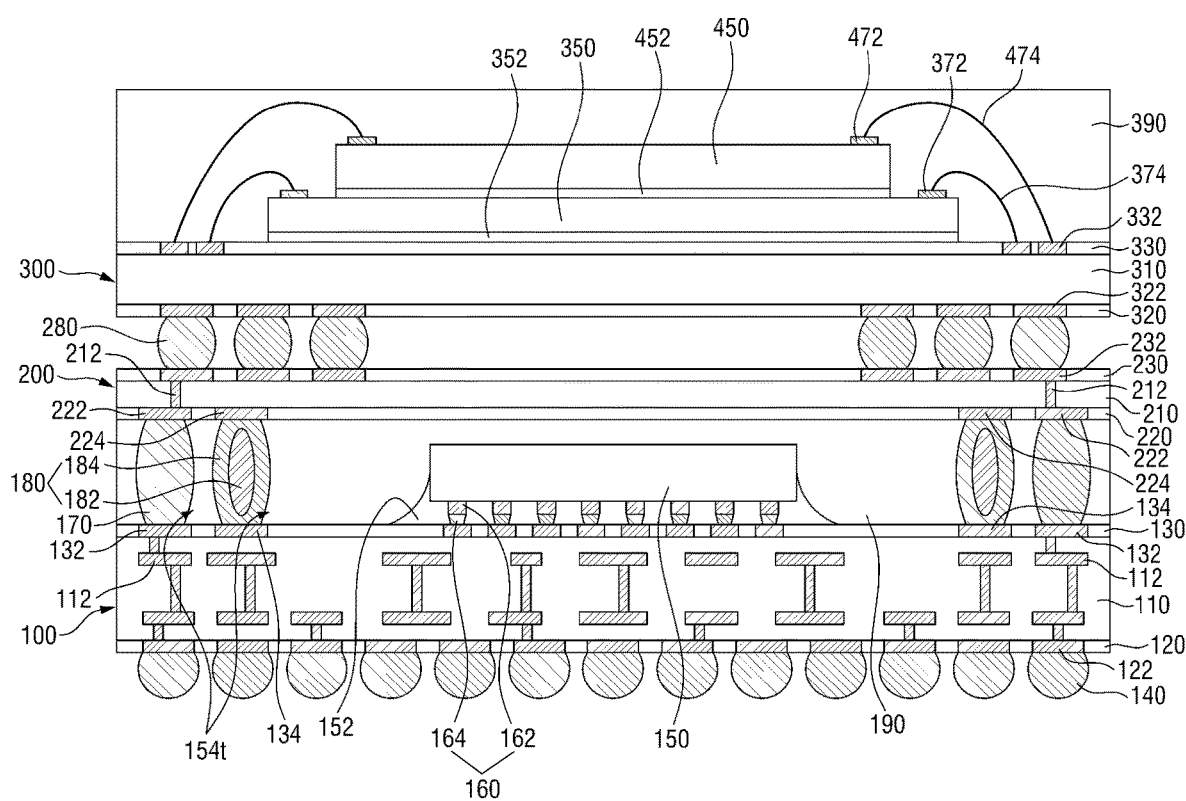
FIG. 11 is a cross-sectional view of a semiconductor package, according to some example embodiments of the present disclosure.

FIG. 11 is a cross-sectional view of a semiconductor package, according to some example embodiments of the present disclosure. For convenience, the semiconductor package of FIG. 11 will hereinafter be described, focusing mainly on the differences with the semiconductor package of FIGS. 1 through 4.

Referring to FIG. 11, a second semiconductor chip 350 may be mounted on a second substrate 300 by a method other than flip-chip bonding.

For example, the second semiconductor chip 350 may be mounted on the second substrate 300 by a first adhesive layer 352. The first adhesive layer 352 may attach the bottom surface of the second semiconductor chip 350 on the top surface of the second substrate 300 via adhesion means. The first adhesive layer 352 may include, for example, at least one of liquid epoxy, an adhesive tape, a conductive medium, and a combination thereof, but the present disclosure is not limited thereto.

In some embodiments, the second semiconductor chip 350 may be electrically connected to the second substrate 300 via first bonding wires 374. For example, the first bonding wires 374 may connect first chip pads 372 of the second semiconductor chip 350 and fourth upper pads 332 of the second substrate 300, but the present disclosure is not limited thereto. For example, the second semiconductor chip 350 may be electrically connected to fourth upper pads 332 via, for example, a bonding tape.

In some embodiments, a plurality of semiconductor chips may be stacked on the second substrate 300. For example, a third semiconductor chip 450 may be stacked on the second semiconductor chip 350.

For example, the third semiconductor chip 450 may be disposed on the second semiconductor chip 350 via a second adhesive layer 452. The second adhesive layer 452 may attach the bottom surface of the third semiconductor chip 450 and the top surface of the second semiconductor chip 350 via adhesion means.

In some embodiments, the third semiconductor chip 450 may be electrically connected to the second substrate 300 via second bonding wires 474. For example, the second bonding wires 474 may connect second chip pads 472 of the third semiconductor chip 450 and the fourth upper pads 332 of the second substrate 300.

FIGS. 12 through 16 are layout views of a semiconductor package, according to some example embodiments of the present disclosure. For convenience, the semiconductor package of FIGS. 12 through 16 will hereinafter be described, focusing mainly on the differences with the semiconductor package of FIGS. 1 through 4.

Figure 12:
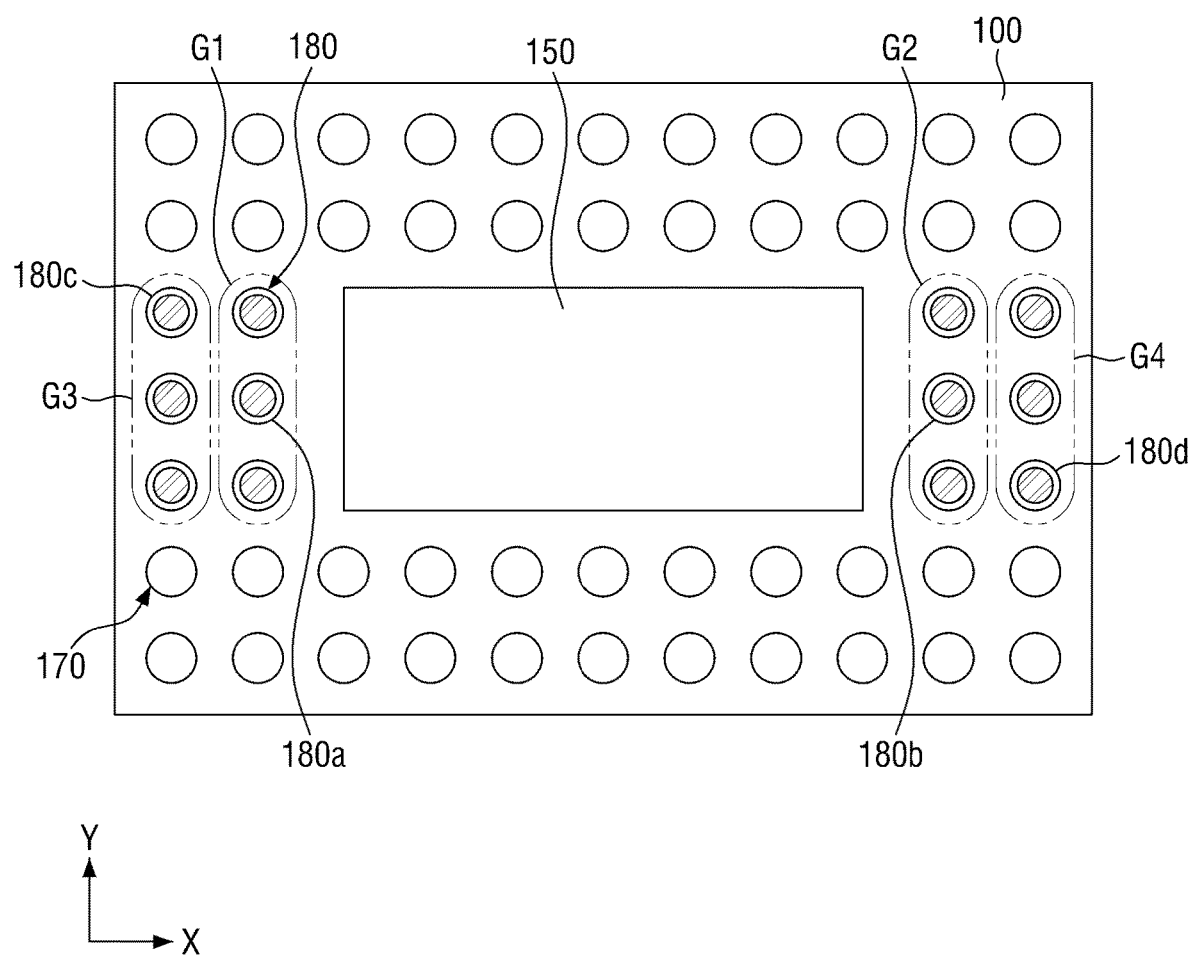
FIGS. 12 through 16 are layout views of a semiconductor package, according to some example embodiments of the present disclosure.

Referring to FIG. 12, a plurality of supporting members 180 may further form third and fourth groups G3 and G4, which are disposed on sides of a first semiconductor chip 150.

The third group G3 may be adjacent to a first group G1 in a first direction X. The third group G3 may include a plurality of third supporting members 180c, which are arranged side-by-side with the first group G1. For example, the plurality of third supporting members 180c may be arranged side-by-side with a plurality of first supporting members 180a in a second direction Y. In some embodiments, distances in the first direction X between a supporting member 180 of the first group G1 and an adjacent supporting member 180 of the third group G3 may be the same as the distance D11 or the distance D12.

The fourth group G4 may be adjacent to a second group G2 in the first direction X. The fourth group G4 may include a plurality of fourth supporting members 180d, which are arranged side-by-side with the second group G2. For example, the plurality of fourth supporting members 180d may be arranged side-by-side with a plurality of second supporting members 180b in the second direction Y. In some embodiments, distances in the first direction X between a supporting member 180 of the second group G2 and an adjacent supporting member 180 of the fourth group G4 may be the same as the distance D11 or the distance D12.

Figure 13:
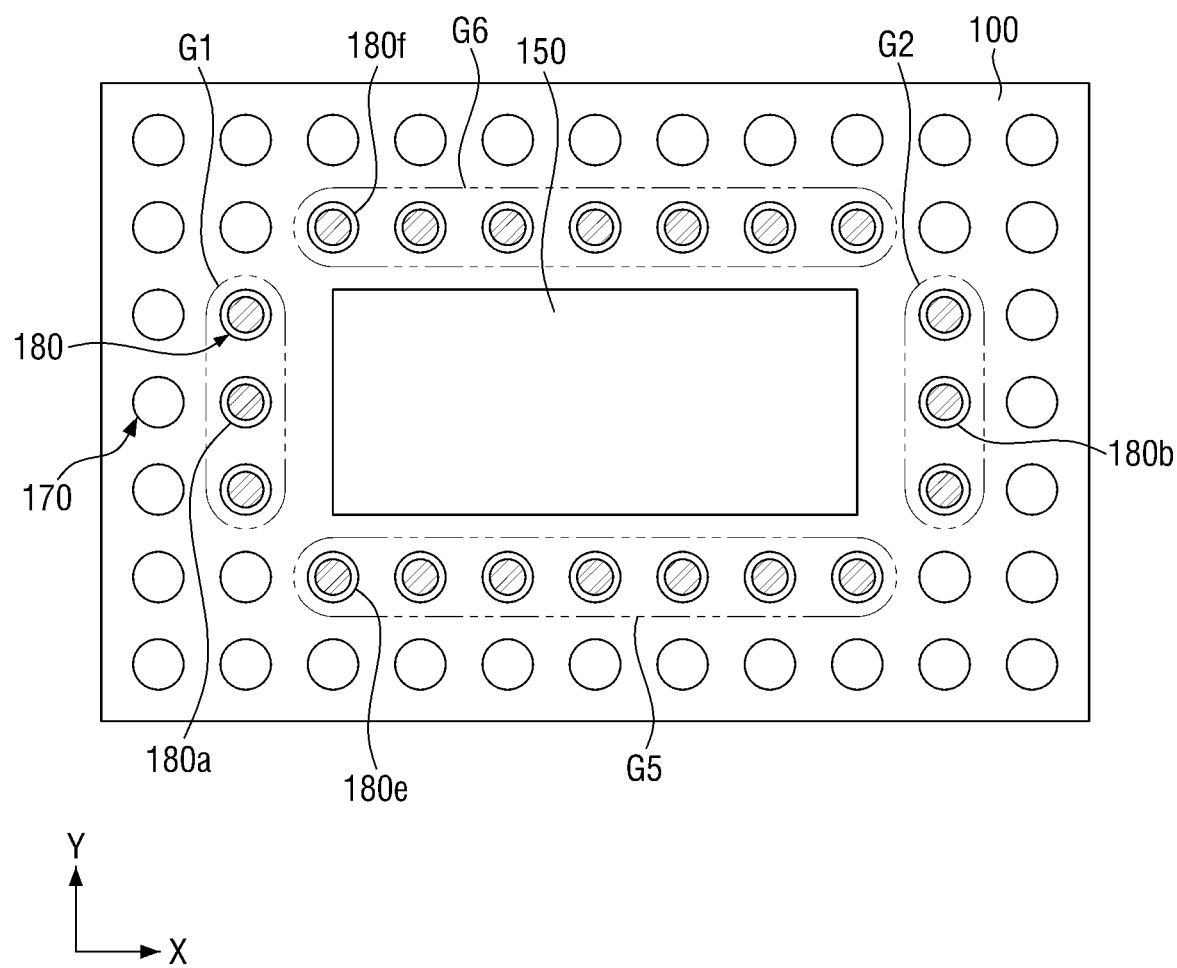

Referring to FIG. 13, the plurality of supporting members 180 may further form fifth and sixth groups G5 and G6, which are disposed on sides of the first semiconductor chip 150.

For example, the first semiconductor chip 150 may have a third side, which is intersects the second direction Y, and a fourth side, which is opposite to the third side. The fifth group G5 may include a plurality of fifth supporting members 180e, which are arranged along the third side of the first semiconductor chip 150. For example, the plurality of fifth supporting members 180e may be arranged along the first direction X. The sixth group G6 may include a plurality of sixth supporting members 180f, which are arranged along the fourth side of the first semiconductor chip 150. For example, the plurality of sixth supporting members 180f may be arranged along the first direction X.

Since the supporting members 180, which include the first, second, fifth and sixth groups G1, G2, G5, and G6, surround the first semiconductor chip 150 in a plan view, the supporting members 180 can support an interposer 200 so that the interposer 200 can maintain a predetermined distance from a first substrate 100 (or from the first semiconductor chip 150) while being bonded on the first substrate 100.

Figure 14:
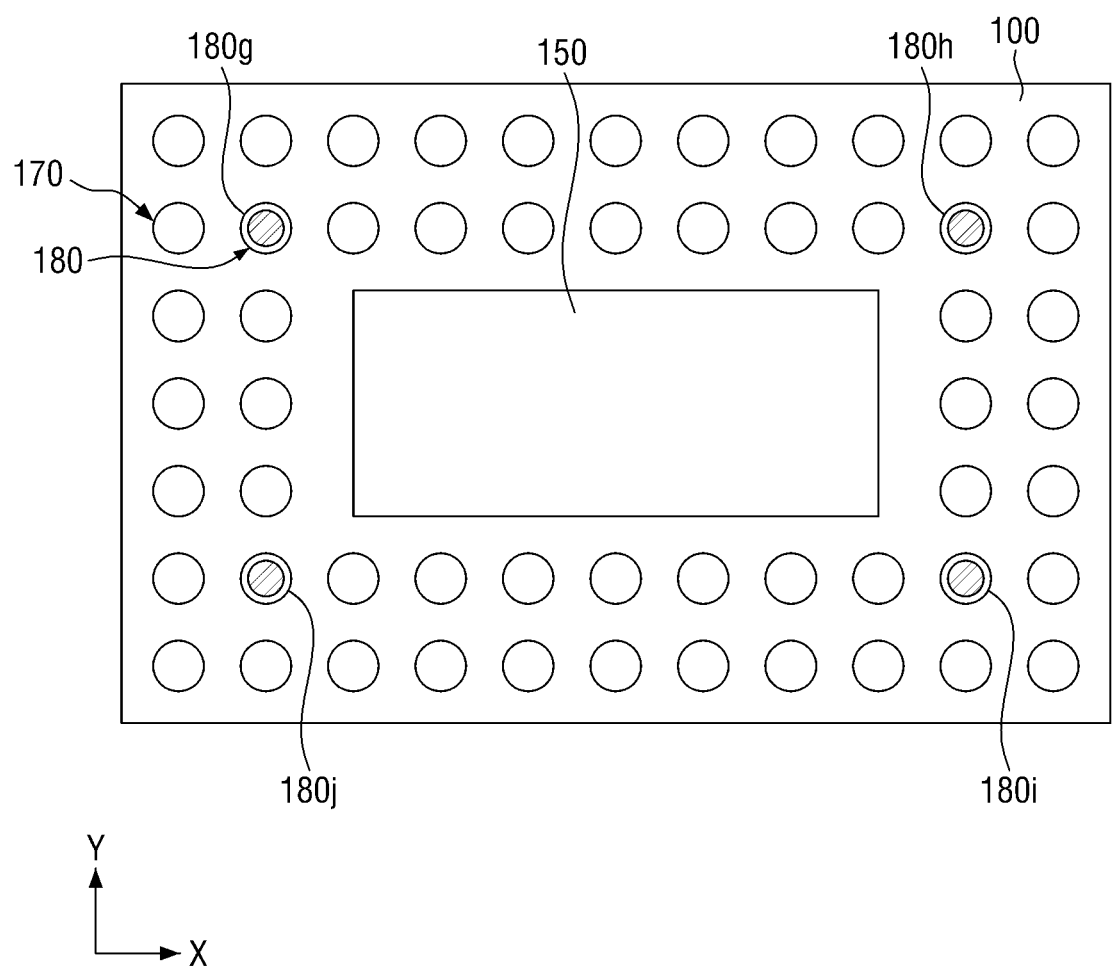

Referring to FIG. 14, there may exist supporting members 180 that are adjacent to the corners of the first semiconductor chip 150 in a plan view.

For example, the first semiconductor chip 150 may have four corners, when viewed in a plan view, and the supporting members 180 may include seventh through tenth supporting members 180g through 180j that are adjacent to the four corners of the first semiconductor chip 150. For example, each of the seventh through tenth supporting members 180g through 180j may be provided at a diagonal to a corresponding one of the corners of the first semiconductor chip 150.

Since the supporting members 180, which include the seventh through tenth supporting members 180g through 180j, are located at the corners of the first semiconductor chip 150 in a plan view, the supporting members 180 can support the interposer 200 so that the interposer 200 can maintain a predetermined distance from the first substrate 100 (or from the first semiconductor chip 150) while being bonded on the first substrate 100.

Figure 15:
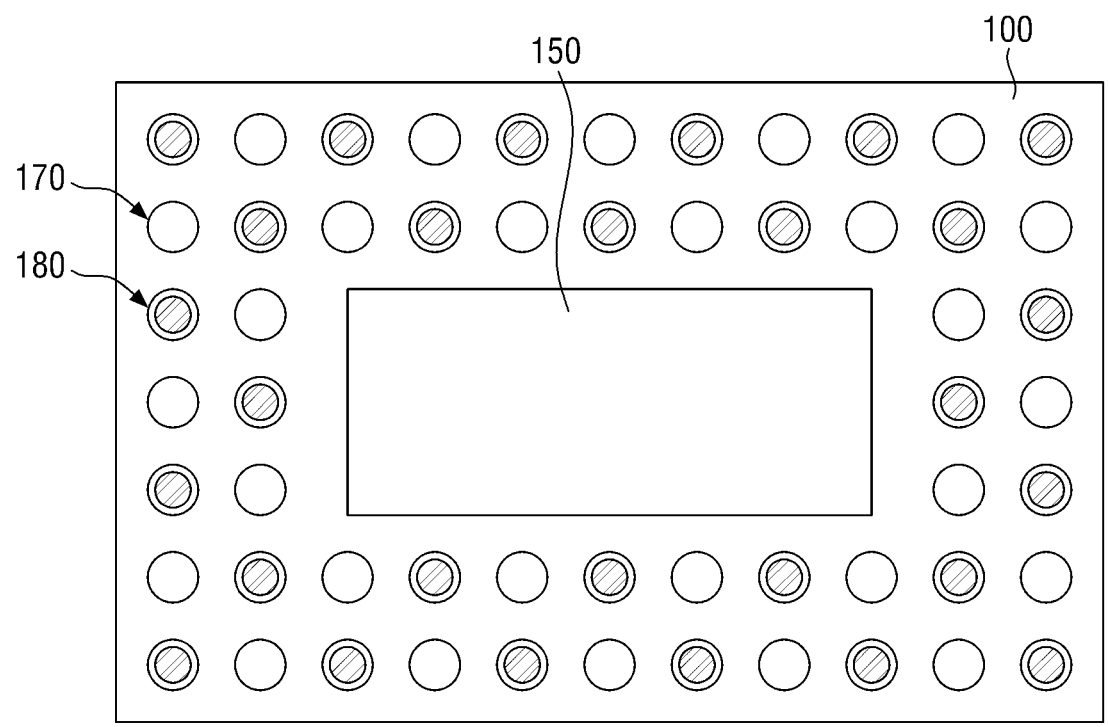

Referring to FIG. 15, the plurality of supporting members 180 may be arranged in a zigzag fashion with respect to a plurality of first connecting members 170, in a plan view.

For example, the first connecting members 170 and the supporting members 180 may be alternately arranged along the first direction X. Also, the first connecting members 170 and the supporting members 180 may be alternately arranged along the second direction Y.

Since the supporting members 180 are arranged in a zigzag fashion with respect to the first connecting members 170, the supporting members 180 can evenly support the interposer 200 while the interposer 200 is being bonded on the first substrate 100. In some embodiments, each of the first connecting members 170 and the supporting members 180 may be spaced equidistant in the first and second directions X and Y from adjacent ones of the first connecting members 170 and the supporting members 180.

Figure 16:
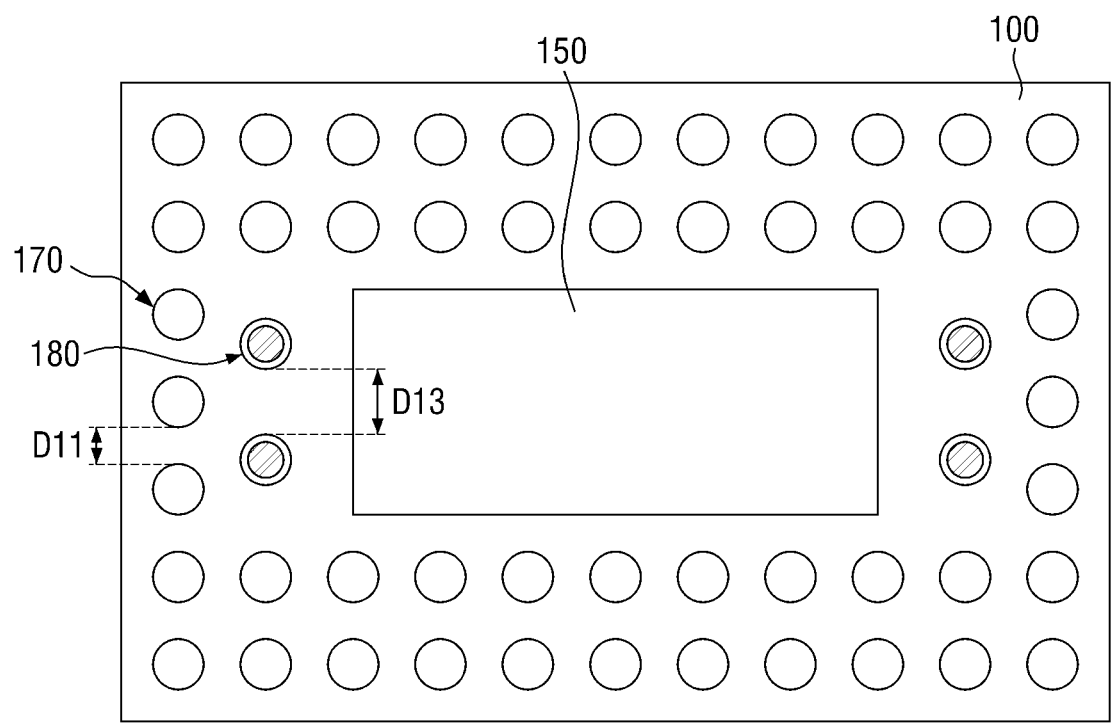

Referring to FIG. 16, a distance D11 in the second direction Y between the plurality of first connecting members 170 may differ from a distance D13 in the second direction Y between the plurality of supporting members 180.

For example, the distance D13 between the plurality of supporting members 180 may be greater than the distance D11 between the plurality of first connecting members 170. Although not specifically illustrated, in another example, the distance D13 between the plurality of supporting members 180 may be smaller than the distance D11 between the plurality of first connecting members 170.

Figure 17:
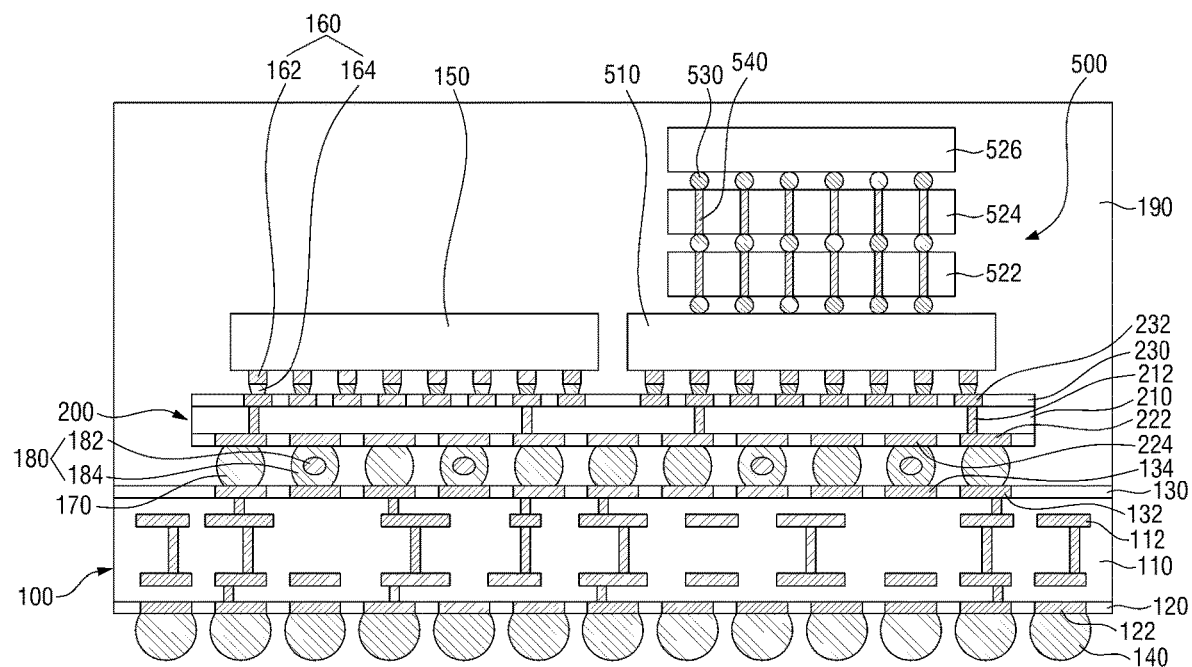
FIG. 17 is a cross-sectional view of a semiconductor package, according to some example embodiments of the present disclosure.

FIG. 17 is a cross-sectional view of a semiconductor package, according to some example embodiments of the present disclosure. For convenience, the semiconductor package of FIG. 17 will hereinafter be described, focusing mainly on the differences with the semiconductor package of FIGS. 1 through 4.

Referring to FIG. 17, a first semiconductor chip 150 is not interposed between a first substrate 100 and an interposer 200.

For example, the first semiconductor chip 150 may be mounted on the top surface of the interposer 200. In some embodiments, first bumps 160 may be in contact with third upper pads 232 of the interposer 200. Accordingly, the first semiconductor chip 150 may be electrically connected to the first substrate 100 via the interposer 200.

In some embodiments, a high-bandwidth memory (HBM) 500 may be mounted on the top surface of the interposer 200. For example, the HBM 500 may include a controller chip 510 and a plurality of memory chips 522, 524, and 526. The controller chip 510 may be mounted on the top surface of the interposer 200, and the memory chips 522, 524, and 526 may be sequentially stacked on the controller chip 510. The controller chip 510 may be a logic chip and each of the plurality of memory chips 522, 524, and 526 may be a memory chip.

In some embodiments, the HBM 500 may include third bumps 530 and through vias 540. The third bumps 530 may be interposed between the controller chip 510 and the plurality of memory chips 522, 524, and 526. The through vias 540 may penetrate the controller chip 510 and at least some of the plurality of memory chips 522, 524, and 526 to be connected to the third bumps 530. Accordingly, the HBM 500 may be electrically connected to the first substrate 100 via the interposer 200.

In some embodiments, the HBM 500 may be electrically connected to the first semiconductor chip 150 via the interposer 200. For example, some of second conductive patterns 212 may connect third upper pads 232 that are in contact with the first semiconductor chip 150 to third upper pads 232 that are in contact with the HBM 500.

A semiconductor package according to some example embodiments of the present disclosure will hereinafter be described with reference to FIG. 18.

Figure 18:
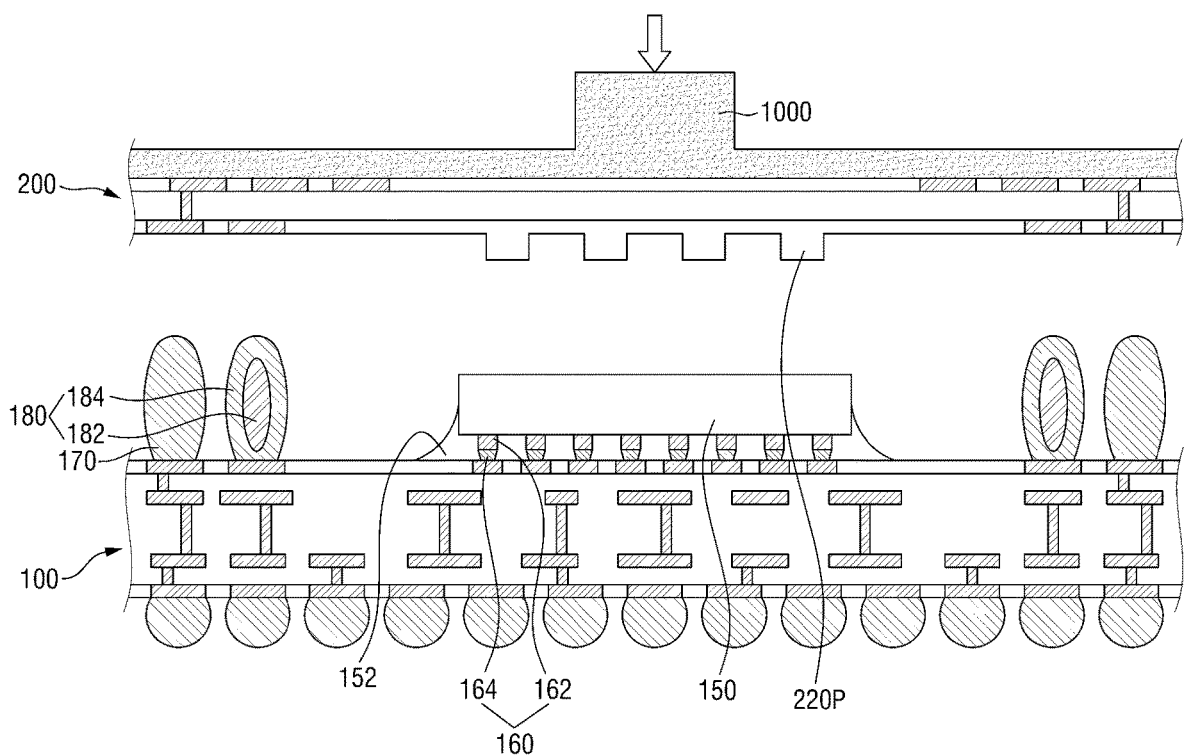
FIG. 18 is a schematic diagram for explaining the process of bonding an interposer on a first substrate, according to some example embodiments of the present disclosure.

FIG. 18 is a schematic diagram for explaining the process of bonding an interposer on a first substrate 100.

Referring to FIG. 18, an interposer 200 may be bonded on a first substrate 100. The bonding of the interposer 200 on the first substrate 100 may be performed by, for example, a thermal compression bonding method in which heat is applied to the interposer 200 while pressing the top surface of the interposer 200 with the use of bonding equipment 1000.

Meanwhile, to prevent defects that may be caused by warpage or the like, the interposer 200 needs to maintain a predetermined distance (e.g., a distance D22) from a first semiconductor chip 150. To this end, the interposer 200 may be equipped with protruding patches 220P, but due to the presence of the protruding patches 220P, part of the top surface of the interposer 200 may undesirably protrude in the process of being pressed with the bonding equipment 1000. This type of defect leads to deterioration of the product quality of the interposer 200.

However, since the semiconductor package of FIG. 18 includes supporting members 180 that include core parts 182, damage to the interposer 200 can be prevented. For example, while the interposer 200 is being bonded on the first substrate 100, solder parts 184 may get wet, and while the supporting members 180 are being attached to the first substrate 100 and the interposer 200, the core parts 182 may support the interposer 200 to maintain a predetermined distance (e.g., a distance D21 or the distance D22) from the first substrate 100 (or a first semiconductor chip 150). Accordingly, a semiconductor package with improved product reliability can be provided.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor package comprising:
   a first substrate including a first insulating layer and first conductive patterns in the first insulating layer;
   an interposer disposed on a top surface of the first substrate and including a second insulating layer and second conductive patterns in the second insulating layer;
   first connecting members in contact with the top surface of the first substrate and a bottom surface of the interposer; and
   supporting members including solder parts, which are in contact with the top surface of the first substrate and the bottom surface of the interposer, and core parts, which are disposed in the solder parts and include a different material from the solder parts,
   wherein the first connecting members electrically connect the first conductive patterns and the second conductive patterns, and
   wherein the supporting members do not electrically connect the first conductive patterns and the second conductive patterns.

2. The semiconductor package of claim 1, wherein the solder parts completely surround the core parts.

3. The semiconductor package of claim 1,
   wherein the solder parts have a first melting point, and
   wherein the core parts have a second melting point, which is higher than the first melting point.

4. The semiconductor package of claim 1, wherein a height of the core parts is 75% to 90% of a height of the first connecting members, in a vertical direction that is perpendicular to the top surface of the first substrate.

5. The semiconductor package of claim 1, wherein a height of the solder parts is the same as a height of the first connecting members, in a vertical direction that is perpendicular to the top surface of the first substrate.

6. The semiconductor package of claim 1,
wherein the first substrate includes an upper passivation film, which covers a top surface of the first insulating layer, and first upper pads, which are exposed by the upper passivation film,
wherein the interposer includes a lower passivation film, which covers a bottom surface of the second insulating layer, and first lower pads, which are exposed by the lower passivation film, and
wherein the first connecting members are in contact with the first upper pads and the first lower pads.

7. The semiconductor package of claim 6,
wherein the first substrate further includes second upper pads, which are spaced apart from the first upper pads and are exposed by the upper passivation film,
wherein the interposer further includes second lower pads, which are spaced apart from the first lower pads and are exposed by the lower passivation film, and
wherein the supporting members are in contact with the second upper pads and the second lower pads.

8. The semiconductor package of claim 1, further comprising:
a semiconductor chip mounted on the top surface of the first substrate and spaced apart from the bottom surface of the interposer.

9. The semiconductor package of claim 8, wherein a plurality of supporting members are arranged along at least one side of the semiconductor chip.

10. The semiconductor package of claim 8, wherein the supporting members are closer than the first connecting members to the semiconductor chip.

11. A semiconductor package comprising:
a first substrate including a first insulating layer and first conductive patterns in the first insulating layer;
an interposer disposed on a top surface of the first substrate and including a second insulating layer and second conductive patterns in the second insulating layer;
first connecting members contacting the first substrate and the interposer, electrically connecting the first conductive patterns and the second conductive patterns; and
supporting members spaced apart from the first connecting members and contacting the first substrate and the interposer,
wherein the supporting members include solder parts, which have a first melting point, and core parts, which are disposed in the solder parts and have a second melting point that is higher than the first melting point, and
wherein the supporting members do not electrically connect the first conductive patterns and the second conductive patterns.

12. The semiconductor package of claim 11, wherein the first connecting members have the first melting point.

13. The semiconductor package of claim 11, wherein a height of the first connecting members is 120 μm to 200 μm in a vertical direction that is perpendicular to the top surface of the first substrate.

14. The semiconductor package of claim 13, wherein a height of the core parts is 90 μm to 180 μm in the vertical direction that is perpendicular to the top surface of the first substrate.

15. The semiconductor package of claim 11, wherein the core parts have a spherical or elliptical spherical shape.

16. The semiconductor package of claim 11, wherein the core parts have a cylindrical or polygonal pillar shape.

17. The semiconductor package of claim 11,
wherein a plurality of first connecting members and a plurality of supporting members are arranged, and
wherein a distance between the plurality of first connecting members is different from a distance between the plurality of supporting members.

18. The semiconductor package of claim 11,
wherein a plurality of first connecting members and a plurality of supporting members are arranged, and
wherein the plurality of first connecting members and the plurality of supporting members are arranged in a zigzag fashion in a plan view.

19. A semiconductor package comprising:
a first substrate including a first insulating layer and first conductive patterns in the first insulating layer;
a first semiconductor chip mounted on a top surface of the first substrate;
an interposer spaced apart from the first semiconductor chip, on the top surface of the first substrate, and including a second insulating layer and second conductive patterns in the second insulating layer;
a second substrate disposed on a top surface of the interposer;
a second semiconductor chip mounted on the second substrate;
first connecting members electrically connecting the first conductive patterns and the second conductive patterns, and contacting the first substrate and the interposer;
supporting members contacting the first substrate and the interposer and including core parts and solder parts, which surround the core parts and include a different material from the core parts; and
second connecting members disposed between the interposer and the second substrate and electrically connecting the interposer and the second substrate,
wherein the supporting members do not electrically connect the first conductive patterns and the second conductive patterns.

20. The semiconductor package of claim 19, wherein a distance between the first substrate and the interposer is 15 μm to 45 μm.

* * * * *